(12) United States Patent
Chu et al.

(10) Patent No.: US 10,553,631 B2
(45) Date of Patent: *Feb. 4, 2020

(54) COLOR FILTER UNIFORMITY FOR IMAGE SENSOR DEVICES

(71) Applicant: Taiwan Semiconductor Manufacturing Co., Ltd., Hsinchu (TW)

(72) Inventors: Yi-Hsing Chu, Tainan (TW); Chun-Hao Chou, Tainan (TW); Kuo-Cheng Lee, Tainan (TW); Yin-Chieh Huang, Tainan (TW); Yun-Wei Cheng, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/414,563

(22) Filed: May 16, 2019

(65) Prior Publication Data

US 2019/0273104 A1 Sep. 5, 2019

Related U.S. Application Data

(63) Continuation of application No. 15/964,353, filed on Apr. 27, 2018, now Pat. No. 10,304,885.

(60) Provisional application No. 62/586,324, filed on Nov. 15, 2017.

(51) Int. Cl.
*H01L 27/146* (2006.01)

(52) U.S. Cl.
CPC .... *H01L 27/14621* (2013.01); *H01L 27/1463* (2013.01); *H01L 27/1464* (2013.01); *H01L 27/14605* (2013.01); *H01L 27/14627* (2013.01); *H01L 27/14685* (2013.01)

(58) Field of Classification Search
None
See application file for complete search history.

(56) References Cited

U.S. PATENT DOCUMENTS

| 9,437,645 B1 | 9/2016 | Chou et al. |
| 9,786,710 B2 | 10/2017 | Chang et al. |
| 10,304,885 B1 * | 5/2019 | Chu ................. H01L 27/14621 |
| 2010/0207225 A1 | 8/2010 | Masuda |

(Continued)

FOREIGN PATENT DOCUMENTS

| TW | 201635502 A | 10/2016 |
| TW | 201721854 A | 6/2017 |

*Primary Examiner* — J. E. Schoenholtz
(74) *Attorney, Agent, or Firm* — Sterne, Kessler, Goldstein & Fox P.L.L.C.

(57) ABSTRACT

The present disclosure is directed to a method for reducing the surface deformation of a color filter after a baking process in an image sensor device. Surface deformation can be reduced by increasing the surface area of the color filter prior to baking. For example, forming a grid structure over a semiconductor layer of an image sensor device, where the grid structure includes a first region with one or more cells having a common sidewall; disposing one or more color filters in a second region of the grid structure; recessing the common sidewall in the first region of the grid structure to form a group of cells with the recessed common sidewall; and disposing another color filter in the group of cells.

20 Claims, 12 Drawing Sheets

(56) References Cited

U.S. PATENT DOCUMENTS

| | | | |
|---|---|---|---|
| 2013/0200251 A1* | 8/2013 | Velichko | H01L 31/02327 250/208.1 |
| 2014/0339615 A1* | 11/2014 | Wang | H01L 27/14621 257/294 |
| 2015/0041813 A1* | 2/2015 | Kim | H01L 27/124 257/59 |
| 2015/0318320 A1 | 11/2015 | Lin et al. | |
| 2017/0040357 A1* | 2/2017 | Yu | H01L 27/1463 |
| 2017/0084652 A1* | 3/2017 | Chang | H01L 27/14603 |

* cited by examiner

COLOR FILTER UNIFORMITY FOR IMAGE SENSOR DEVICES

CROSS-REFERENCE TO RELATED APPLICATION

This application is a continuation of U.S. Non-Provisional patent application Ser. No. 15/964,353, filed on Apr. 27, 2018 and titled "Color Filter Uniformity for Image Sensor Devices," which claims the benefit of U.S. Provisional Patent Application No. 62/586,324, filed on Nov. 15, 2017 and titled "Color Filter Uniformity for Image Sensor Devices." The entire contents of both applications are incorporated by reference herein in their entireties.

BACKGROUND

Semiconductor image sensors are used to sense visible or non-visible radiation; such as, for example, visible light, infrared light, etc. Complementary metal-oxide-semiconductor (CMOS) image sensors (CIS) and charge-coupled device (CCD) sensors are used in various applications such as digital still cameras, mobile phones, tablets, goggles, etc. Arrays of pixels featured in CMOS and CIS devices can sense incoming radiation that is projected toward the sensor and convert it into electrical signals.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
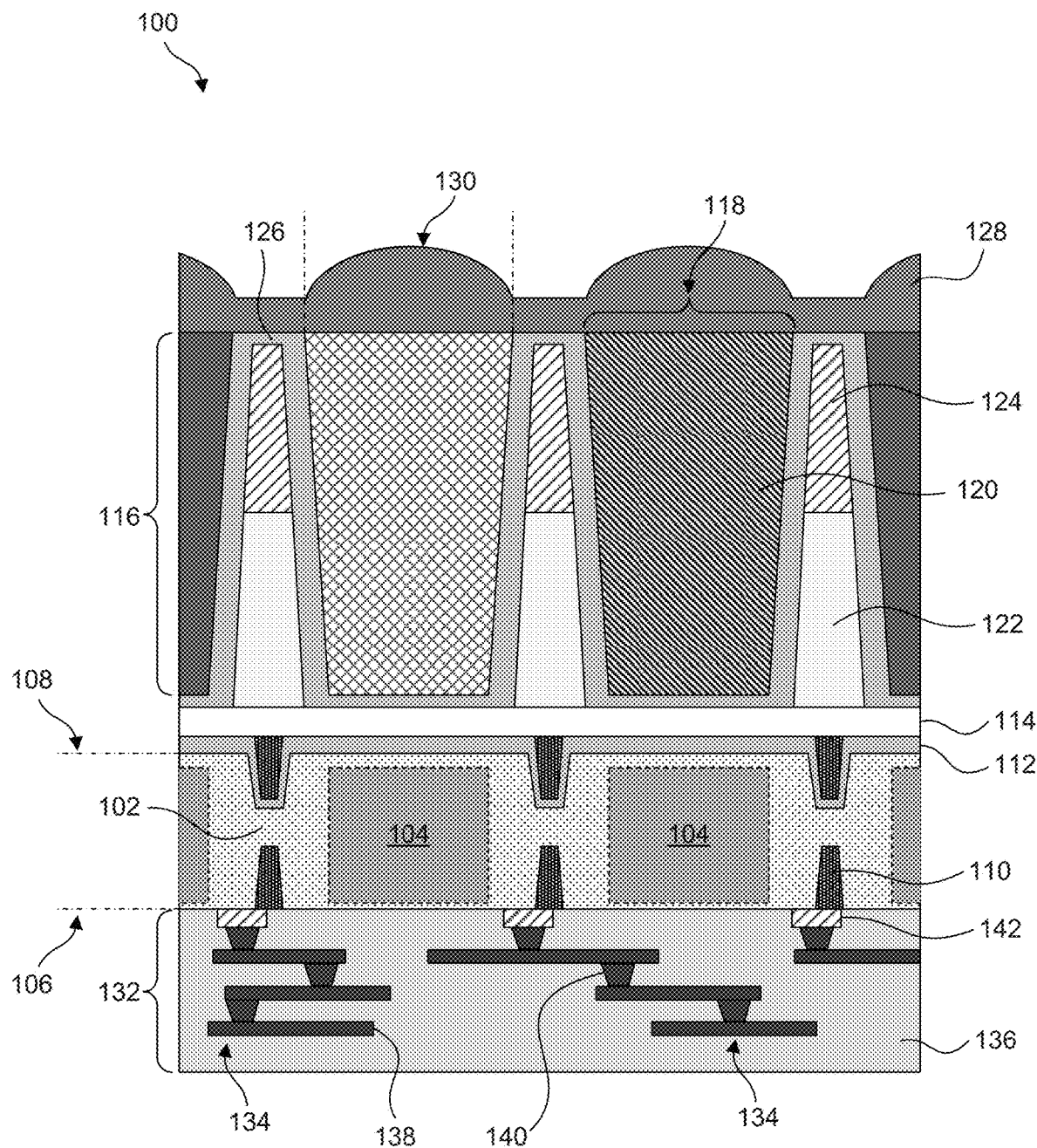
FIG. 1 is a cross-sectional view of a backside illuminated image sensor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially, relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

One type of image sensor device is a back side illuminated image sensor device. In a back side illuminated image sensor device, color filters and micro-lenses are positioned on the back side of a substrate (e.g., on an opposite side of the substrate's circuitry), so that the image sensor device can collect light with minimal or no obstructions. As a result, back side illuminated image sensor devices are configured to detect light from the back side of the substrate, rather than from a front side of the substrate where the color filters and micro-lenses of the image sensor device are positioned between the substrate's circuitry and the pixels. Compared to front side illuminated image sensor devices, back side illuminated image sensor devices have improved performance under low light conditions and higher quantum efficiency (QE) photon to electron conversion percentage).

Image sensor devices use color filters to capture color information from incident light rays. For example, the image sensor device—through the use of color filters—can detect the red, green, and blue (RGB) regions of the visible light spectrum. A composite grid structure, which includes cells that can be filled with color filter material, is used to position the color filter material above pixels of the image sensor device.

Once the composite grid structure is filled with color filters (e.g., red, green, or blue), a bake is performed to harden the color filter material. As the color filter material hardens, its top surface area shrinks by an amount. Further, each color filter can exhibit a different shrinkage amount.

For example, the green color filter can shrink from about 14% to about 18% (e.g., about 14.7% to about 18%), the red color filter can shrink from about 13% to about 16% (e.g., about 13.2% to about 16.2%), and the blue color filter can shrink from about 7% to about 9% (e.g., about 7.5% to about 9%). As the color filters shrink, their top surface deforms and changes from flat to convex. The degree of the top surface deformation can be proportional to the shrinkage amount. For example, the green color filter, which shrinks the most, can be more prone to deformation compared to the red or blue color filters. Further, color filter shrinkage can impact color shielding uniformity (CSU), which is an indicator of color uniformity across a pixel area (e.g., an index to check color uniformity on photo diagonals). Poor color shielding uniformity can result in performance degradation of the image sensor device.

Various embodiments in accordance with this disclosure provide a method to reduce the top surface deformation of a color filter after a baking process. This can be accomplished by allowing the color filter to expand to one or more adjacent cells and thus increase the color filter's top surface area. In an example, assuming that two same-color color filters occupy two adjacent cells of a composite grid structure, a common sidewall of the adjacent cells can be selectively recessed so that the two color filters can be combined into a single color filter with a larger top surface area that stretches across the two adjacent cells. The common top surface can be, for example, double the size of the individual top surfaces of the color filters.

FIG. 1 is a simplified cross-sectional view of a back side illuminated image sensor device 100, according to some embodiments of the present disclosure. Back side illuminated image sensor device 100 includes a semiconductor layer 102 with radiation-sensing areas 104. By way of example and not limitation, semiconductor layer 102 includes a silicon material doped with a p-type dopant, such as boron. Alternatively, semiconductor layer 102 can include silicon that is doped with an n-type dopant, such as phosphorous or arsenic. Semiconductor layer 102 can also include other elementary semiconductors, such as germanium or diamond. Semiconductor layer 102 can optionally include a compound semiconductor and/or an alloy semiconductor. Further, semiconductor layer 102 can include an epitaxial layer, which may be strained for performance enhancement. Semiconductor layer 102 can include a silicon-on-insulator (SOI) structure.

Semiconductor layer 102 has a front side (also referred to as a "bottom surface") 106 and a back side (also referred to as a "top surface") 108. Semiconductor layer 102 has a thickness that can range from about 100 µm to about 3000 µm.

Radiation-sensing regions or pixels 104 are formed in the semiconductor layer 102. As disclosed herein, the terms "radiation-sensing regions" and "pixels" may be used interchangeably. Pixels 104 are configured to sense radiation, such as incident light rays impinging semiconductor layer 102 from back side 108. Each of the radiation-sensing regions or pixels 104 include a photodiode that can convert photons to charge, according to some embodiments of the present disclosure. In some embodiments of the present disclosure, pixels 104 can include photodiodes, transistors, amplifiers, other similar devices, or combinations thereof. Pixels 104 may also be referred to herein as "radiation-detection devices" or "light-sensors."

For simplicity, two pixels 104 are illustrated in FIG. 1, but additional pixels 104 can be implemented in semiconductor layer 102. By way of example and not limitation, pixels 104 can be formed using an ion implant process on semiconductor layer 102 from front side 106. Pixels 104 can also be formed by a dopant diffusion process.

Pixels 104 are electrically isolated from each other with isolation structures 110. Isolation structures 110 can be trenches etched into semiconductor layer 102 and filled with a dielectric material, such as silicon oxide, silicon nitride, silicon oxynitride, fluorine-doped silicate glass (FSG), a low-k dielectric material (e.g., a material with a k value lower than 3.9), and/or a suitable insulating material. According to some embodiments of the present disclosure, isolation structures 110 on back side 108 of semiconductor layer 102 have an anti-reflective coating (ARC) 112. ARC 112 is a liner layer that can prevent incoming light rays from being reflected away from radiation-sensing areas/pixels 104. ARC 112 can include a high-k material (e.g., a material with a k-value lower than 3.9), such as hafnium oxide ($HfO_2$), tantalum pentoxide ($Ta_2O_5$), zirconium dioxide ($ZrO_2$), aluminum oxide ($Al_2O_3$), or any other high-k material. ARC 112 can be deposited using a sputtering process, a chemical vapor deposition (CVD)-based process, an atomic layer deposition (ALD)-based techniques, or any other suitable deposition technique. In some embodiments of the present disclosure, the thickness of ARC 112 can range from about 10 Å to about 500 Å.

Back side illuminated image sensor device 100 also includes a capping layer 114 formed over the semiconductor layer 102, such as over the ARC 112, as illustrated in FIG. 1. In some embodiments of the present disclosure, capping layer 114 can provide a planar surface on which additional layers of back side illuminated image sensor device 100 can be formed. Capping layer 114 can include a dielectric material, such as silicon oxide ($SiO_2$), silicon nitride ($Si_3N_4$), silicon oxy-nitride (SiON), or any other suitable dielectric material. Further, capping layer 114 can be deposited using CVD or any other suitable deposition technique. In some embodiments of the present disclosure, the thickness of capping layer 114 can range between about 500 Å and about 2000 Å.

Further, back side illuminated image sensor device 100 includes a composite grid structure 116 formed over capping layer 114. According to some embodiments of the present disclosure, composite grid structure 116 includes cells 118 arranged in columns and rows, where each cell 118 is aligned to a respective radiation-sensing area 104. As mentioned above, cells 118 can receive a red, green, or blue color filter 120.

Figure 2:
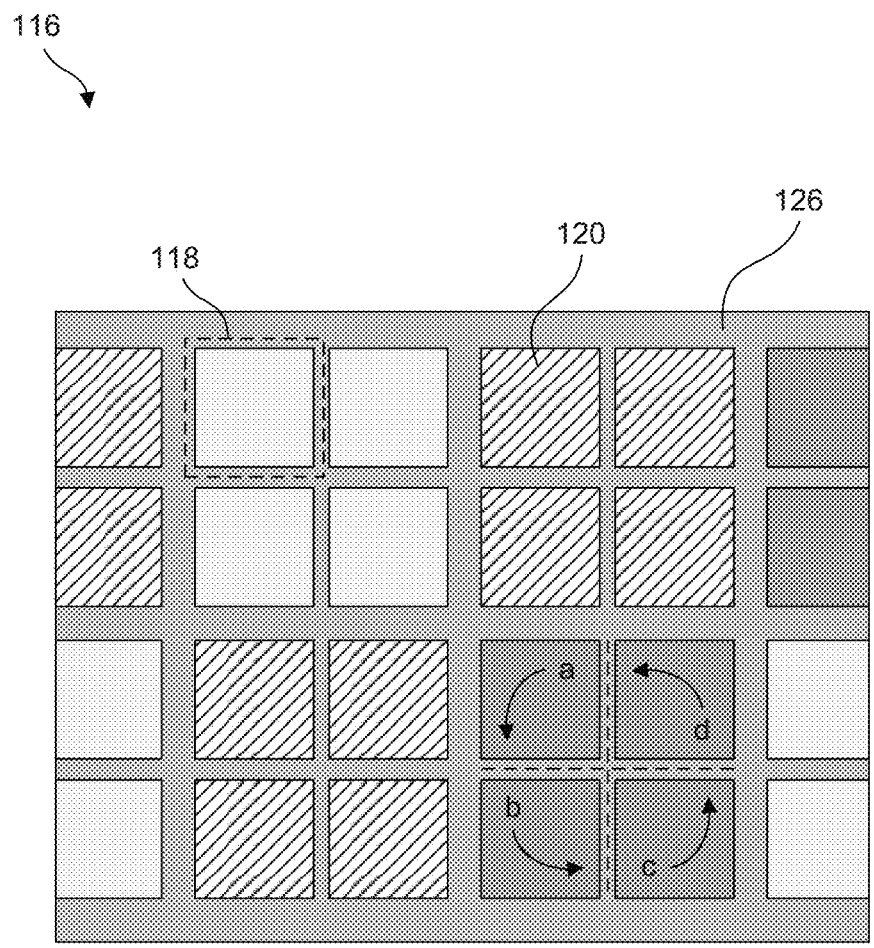
FIG. 2 is a top view of a composite grid structure configured to receive color filters, according to some embodiments.

FIG. 2 is a top view of composite grid structure 116, according to some embodiments. Each cell 118 of composite grid structure 116 is filled with a single color filter 120. By way of example and not limitation, neighboring cells 118 may be filled with the same-color color filter. For example, as shown in FIG. 2, four adjacent cells 118 can be filled with the same color filter 120—e.g., four adjacent cells 118 have a filter with the same color (red, green, or blue). Consequently, cells 118—which are part of a quadrant—share four sidewalls a, b, c, and d. In this example, the color filters in each cell 118 are kept isolated from one another via common sidewalls a, c, and d. The number of cells 118 filled with the same color filter 120, as depicted in FIG. 2, is exemplary and not limiting. Therefore, a group of neighboring cells 118 filled with the same color filter 120 can be larger or smaller (e.g., two, six, etc.)

Referring to FIG. 1, cells 118 of composite grid structure 116 can be formed by depositing a bottom layer 122 and a top dielectric layer 124 and selectively etching away portions of the bottom layer and top dielectric layer to form cells 118. By way of example and not limitation, composite grid structure 116 can be formed as follows: bottom layer 122 and top dielectric layer 124 can be blanket deposited on capping layer 114. One or more photolithography and etch operations can be used to pattern bottom layer 122 and top dielectric layer 124 to form the sidewalls of cells 118. The photolithography and etch operations can be performed so that each cell 118 of composite grid structure 116 is aligned to respective pixels 104 of semiconductor layer 102. In some embodiments, the sidewall height of each cell 118 of composite grid structure 116 can range from about 200 nm to about 1000 nm.

Bottom layer 122 of cell 118 can be made of titanium, tungsten, aluminum, or copper. However, bottom layer 122 of cells 118 may not be limited to metals and may include other suitable materials or stack of materials that can reflect and guide incoming visible light towards radiation-sensing areas 104. In some embodiments of the present disclosure, bottom layer 122 of cells 118 is formed using a sputtering process, a plating process, an evaporation process, or any other suitable deposition method. According to some embodiments of the present disclosure, the thickness of bottom layer 122 of each cell 118 can range from about 100 Å to about 3000 Å.

Top dielectric layer 124 can include one or more dielectric layers. In some embodiments, top dielectric layer 124 can protect previously-formed layers of back side illuminated image sensor device 100 (e.g., bottom layer 122 and capping layer 114). Top dielectric layer 124 can allow incoming light to pass through and reach radiation-sensitive areas (or pixels) 104. Top dielectric layer 124 can be made of a transparent material or materials. In some embodiments of the present disclosure, top dielectric layer 124 can be made of $SiO_2$, $Si_3N_4$, SiON, or any other suitable transparent dielectric material. Top dielectric layer 124 can be deposited by CVD or AT D and can have a deposited thickness range from about 1000 Å to about 3000 Å, according to some embodiments.

Cells 118 can also include a passivation layer 126, which is interposed between color filter 120 and the sidewalls of cells 118 (e.g., bottom layer 122 and dielectric layer 124). In some embodiments of the present disclosure, passivation layer 126 can be conformally deposited by a CVD-based or an ALD-based deposition technique. Passivation layer 126 can be formed from a dielectric material, such as $SiO_2$, $Si_3N_4$, or SiON. Further, passivation layer 126 can have a thickness between about 375 Å to about 625 Å.

In some embodiments, the top surface of color filters 120 can be aligned to the top surface of passivation layer 126 on dielectric layer 124. Alternatively, color filters 120 can be formed above the top surface of passivation layer 126 on dielectric layer 124. For example and explanation purposes, the top surface of color filters 120 will be described as being aligned to the top surface of passivation layer 126 on dielectric layer 124.

Referring to FIG. 1, after cells 118 of composite grid structure 116 receive their respective color filters 120, a transparent material layer 128 can be formed over composite grid structure 116 and color filters 120. Transparent material layer 128 can be in contact with passivation layer 126 if the top surface of color filters 120 is aligned to the top surface of passivation layer 126 over dielectric layer 124. Alternatively, transparent material layer 128 may not be in contact with passivation layer 126 if the top surface of color filters 120 is above the top surface of passivation layer 126 over dielectric layer 124. In some examples, transparent material layer 128 forms a micro-lens 130 over each cell 118 of composite grid structure 116. Micro-lenses 130 are aligned with respective radiation-sensing areas 104 and are formed so they cover the top surface of color filters 120 within the boundaries of cell 118 (e.g., contained within the sidewalls of each cell 118). Transparent material layer 128 can be an oxide deposited by CVD, according to some embodiments.

Micro-lenses 130, due to their curvature, are thicker than other areas of transparent material layer 128 (e.g., areas between micro-lenses 130 above dielectric layer 124). For example, referring to FIG. 1, transparent material layer 128 is thicker over color filter 120 (e.g., where micro-lens 130 is formed) and thinner in areas between micro-lenses 130 (e.g., above dielectric layer 124).

Referring to FIG. 1, back side illuminated image sensor device 100 can also include an interconnect structure 132. Interconnect structure 132 can include patterned dielectric layers and conductive layers that form interconnects (e.g., wiring) between pixels 104 and other components (not shown in FIG. 1). Interconnect structure 132 may, for example be, one or more multilayer interconnect (MLI) structures 134 embedded in an interlayer dielectric (ILD) layer 136. According to some embodiments of the present disclosure, MLI structures 134 can include contacts/vias and metal lines. For purposes of illustration, multiple conductive lines 138 and vias/contacts 140 are shown in FIG. 1. The position and configuration of conductive lines 138 and vias/contacts 140 can vary depending on design needs and are not limited to the depiction of FIG. 1. Further, interconnect structure 132 can include sensing devices 142. Sensing devices 142 can be, for example, an array of field effect transistors (FETs) and/or memory cells that are electrically connected to respective radiation-sensing areas (or pixels) 104 and configured to read the electrical signal produced in those areas as a result of a light-to-charge conversion process.

In some embodiments of the present disclosure, interconnect structure 132 can be a top layer of a partially-fabricated integrated circuit (IC) or of a fully-fabricated IC that can include multiple layers of interconnects, resistors, transistors, and/or other semiconductor devices. As a result, interconnect structure 132 can include front end of the line (FEOL) and middle of the line (MOL) layers. Furthermore, interconnect structure 132 can be attached via a buffer layer (not shown in FIG. 1) to a carrier substrate (not shown in FIG. 1) that can provide support to the structures fabricated thereon (e.g., interconnect layer 132, semiconductor layer 102, etc.). The carrier substrate can be, for example, a silicon wafer, a glass substrate, or any other suitable material.

In some embodiments of the present disclosure, to fabricate back side illuminated image sensor device 100, semiconductor layer 102 can be formed on a silicon substrate (e.g., silicon wafer) and interconnect structure 132 can be subsequently formed over front side 106 of semiconductor layer 102. Interconnect structure 132 can undergo multiple photolithography, etch, deposition, and planarization operations before it is completed. Once interconnect structure 132 is formed, a carrier substrate, as discussed above, can be attached to the top of interconnect structure 132. For example, a buffer layer can act as an adhesion medium between the carrier substrate and interconnect structure 132. The silicon substrate can be turned upside down, and the silicon substrate can be mechanically grinded and polished until back side 108 of semiconductor layer 102 is exposed. Isolation structures 110 on back side 108 of semiconductor layer 102 can be subsequently formed to further electrically isolate radiation-sensing areas or pixels 104. Capping layer 114, along with the composite grid structure 116, can be formed on back side 108 of semiconductor layer 102.

Composite grid structure 116 can be formed so that each of its cells 118 is aligned to respective radiation-sensing areas or pixels 104. Alignment of composite grid structure 116 and radiation-sensing areas, or pixels, 104 can be achieved with photolithographic operations based on, for example, alignment marks present on back side 108 of semiconductor layer 102. The formation of composite grid structure 116 can include the deposition and subsequent patterning of bottom layer 122 and dielectric layer 124 using photolithography and etch operations to form cells 118. Passivation layer 126 is subsequently deposited over the exposed surfaces of bottom layer 122 and dielectric layer 124. Color filters 120 can fill cells 118, and transparent material layer 128 can be deposited thereon to form microlenses 130. Fabrication of back side illuminated image sensor device 100 is not limited to the operations described above and additional or alternative operations can be performed.

Figure 3:
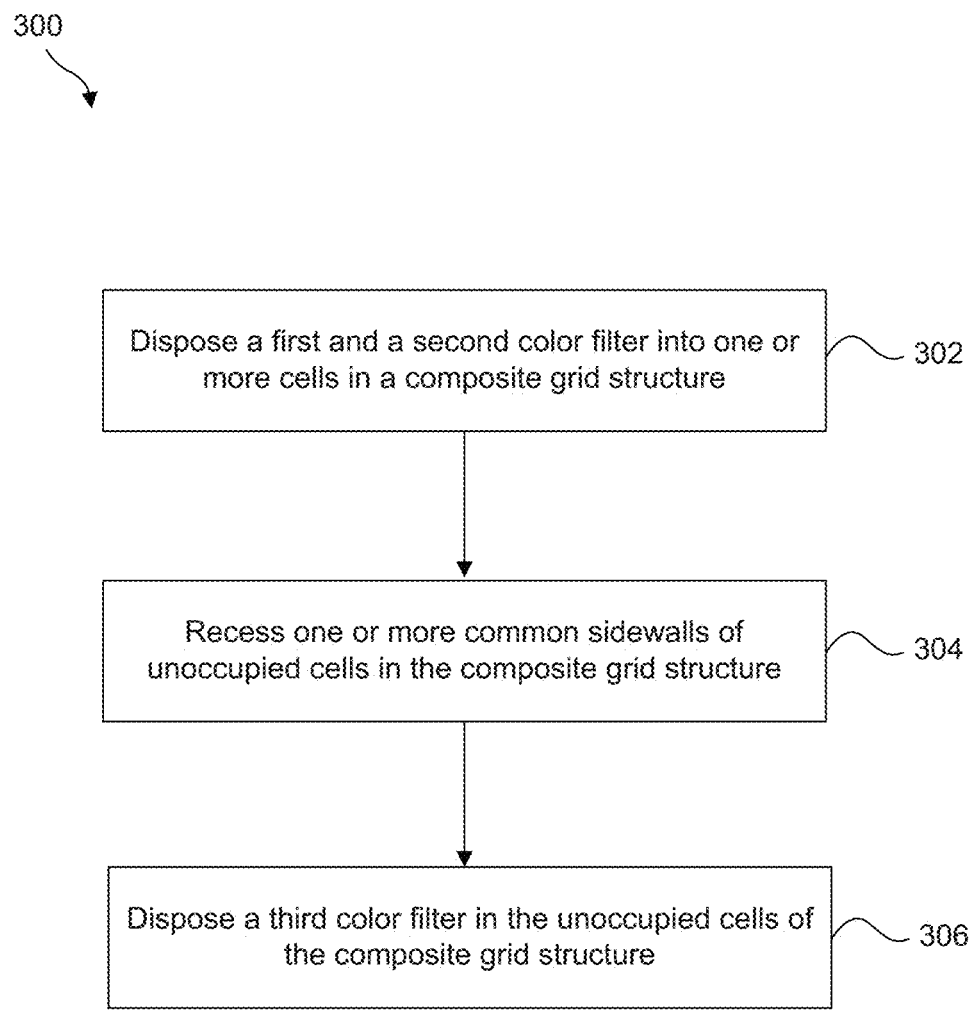
FIG. 3 is a flow chart of a method to suppress surface deformation of a color filter after a baking operation, according to some embodiments.

FIG. 3 is a flowchart of an exemplary method 300 for disposing one or more color filters in a composite grid structure of a back side illuminated image sensor device with minimal top surface deformation of the color filters. For example purposes, method 300 will be described in the context of back side illuminated image sensor device 100 of FIG. 1. According to some embodiments, method 300 utilizes an etch process that can recess commonly shared sidewalls between a selected group of cells 118 so that the color filter occupying the group of cells 118 has a larger surface area. Method 300 is not limited to the operations described below. Other fabrication operations can be performed between the various operations of method 300 and are omitted merely for clarity.

Figure 4:
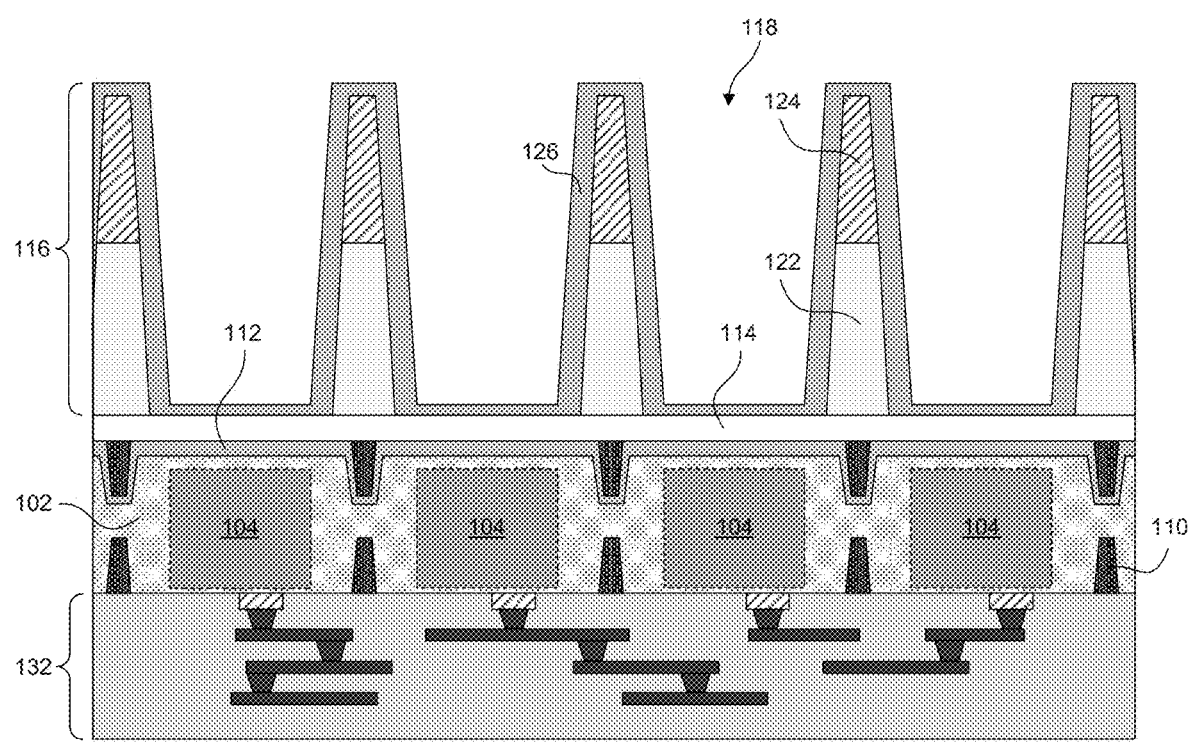
FIG. 4 is a cross-sectional view of a composite grid structure on a semiconductor layer of a partially fabricated image sensor device, according to some embodiments.

Method 300 begins with operation 302, where one or more color filters are disposed into a subset of cells (e.g., one or more cells) in a composite grid structure. FIG. 4 shows a partially fabricated back side illuminated image sensor device, such as back side illuminated image sensor device 100 of FIG. 1. One or more color filters can be disposed into cells of composite grid structure 116. In some embodiments, the selection of the color filters is based on surface deformation characteristics after a baking process. For example, color filters exhibiting low surface deformation (e.g., with a top surface shrink percentage less than 15) can be candidates for operation 302—as opposed, for example, to color filters that exhibit high surface deformation (e.g., with a top surface shrink percentage greater than 15). In some embodiments, candidate color filters for operation 302 are, for example, the red and blue color filters.

Figure 5:
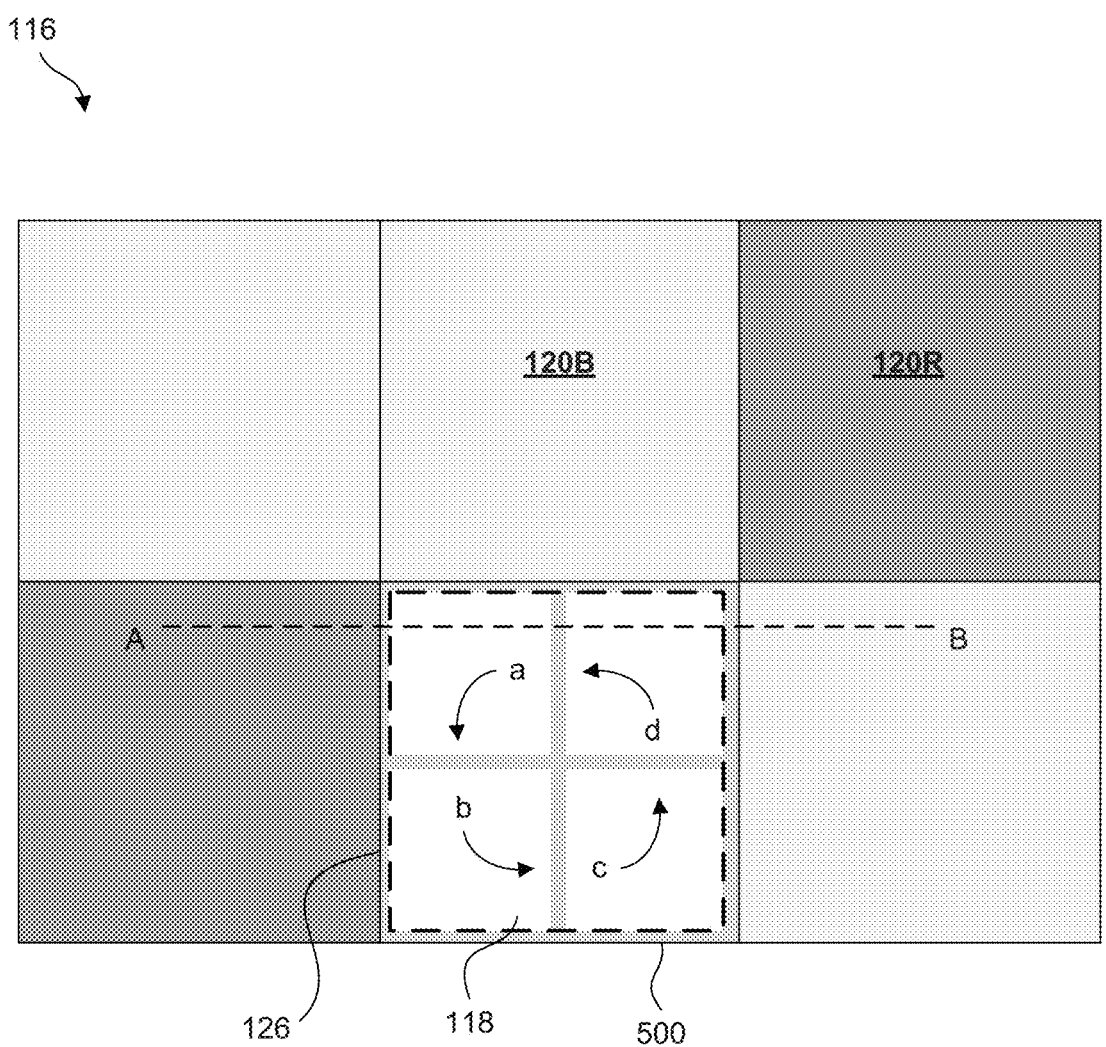
FIG. 5 is a top view of a composite grid structure with a group of unoccupied cells having common sidewalk, according to some embodiments.

In referring to FIG. 5, which is a top view of composite grid structure 116 shown in FIG. 4, red color filters 120R and blue color filter 120B are disposed into one or more cells 118. By way of example and not limitation, selective placement of a color filter (e.g., blue, red, or green) into cells 118 of composite grid structure 116 can be accomplished by selectively covering areas (e.g., cells 118) of composite grid structure 116 that receive a different color filter. For example, if red color filter 120R is the first color filter that will be introduced into cells 118 of composite grid structure 116, a photoresist or a mask layer (not shown in FIG. 5) can be disposed and patterned on composite grid structure 116 so that the patterned photoresist or mask layer masks the cells 118 that will receive a different color filter (e.g., blue or green). Subsequently, exposed cells 118 of composite grid structure 116 can be filled with red color filter 120R, according to a desired design. The same process can be repeated to introduce blue color filter 120B in one or more predetermined cells 118 of composite grid structure 116. In some embodiments, red color filters 120R and blue color filters 120B cover portions of passivation layer 126 above dielectric layer 124, shown as area 600 in FIG. 6. After the red and blue color filters are being disposed into their respective cells 118, the photoresist or mask layer can be removed from composite grid structure 116.

As a result of operation 302, a select number of cells 118 (e.g., in composite grid structure 116) is left unoccupied (e.g., without a color filter). In some embodiments, unoccupied cells 118 are clustered together to form groups of cells that include two, four, six, or any even number of cells 118. Based on the above description, FIG. 5 shows an exemplary group 500 of unoccupied cells 118 in composite grid structure 116. Group 500 includes four unoccupied cells 118 clustered together after red and blue color filters 120R and 120B have been disposed in composite grid structure 116. As discussed above, red color filters 120R and blue color filters 120B have been disposed into composite grid structure 116 so that they cover passivation layer 126 of their respective cells 118. However, passivation layer 126 remains exposed for group 500 of cells 118 since these cells were previously covered by photoresist or a masking layer.

Figure 6:
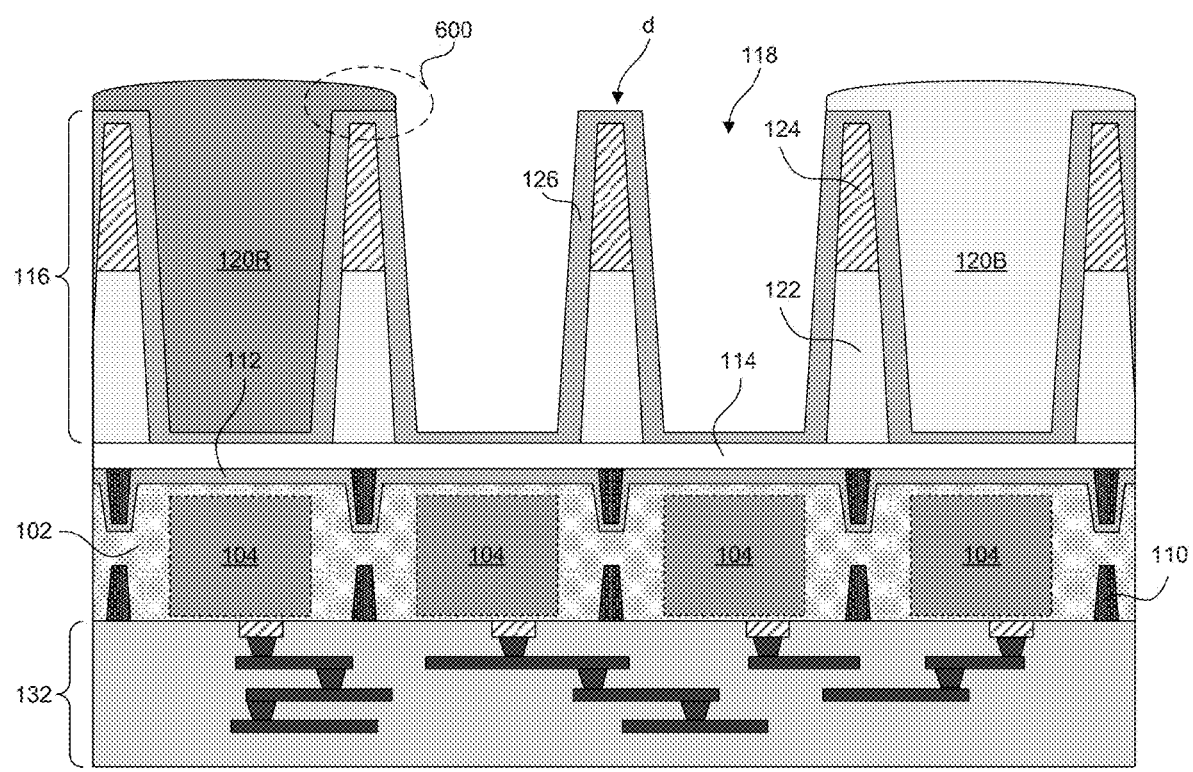
FIG. 6 is a cross-sectional view of a composite grid structure after red and blue color filters have been disposed in cells of a composite grid structure, according to some embodiments.

Further, each cell 118 of group 500 shares at least two sidewalls with two other cells the group. For example, in FIG. 5 the cells in group 500 share sidewalls a, b, c, and d. For illustration purposes, FIG. 5 shows four unoccupied cells 118 clustered together in group 500. However this is not limiting, and group 500 can include fewer or additional cells. Further, additional groups of cells, such as group 500, are possible across composite grid structure 116. In some embodiments, the size and/or number of unoccupied groups of cells—after operation 302—can depend on the design and/or specifications of the image sensor device. FIG. 6—which is a cross section of FIG. 5 across line A-B—shows the exposed common sidewall d between two adjacent empty cells 118 of group 500.

In referring to FIG. 3, method 300 continues with operation 304, where an etch process is used to recess common sidewalls a, b, c, and d of cells 118 in group 500 (shown in FIG. 5). In some embodiments, and in referring to FIGS. 5 and 6, areas of the image sensor exposed to the etch process include the top surfaces of color filters 120R and 120B, and common sidewalls a, b, c, and d of unoccupied cells 118 in group 500.

Figure 7:
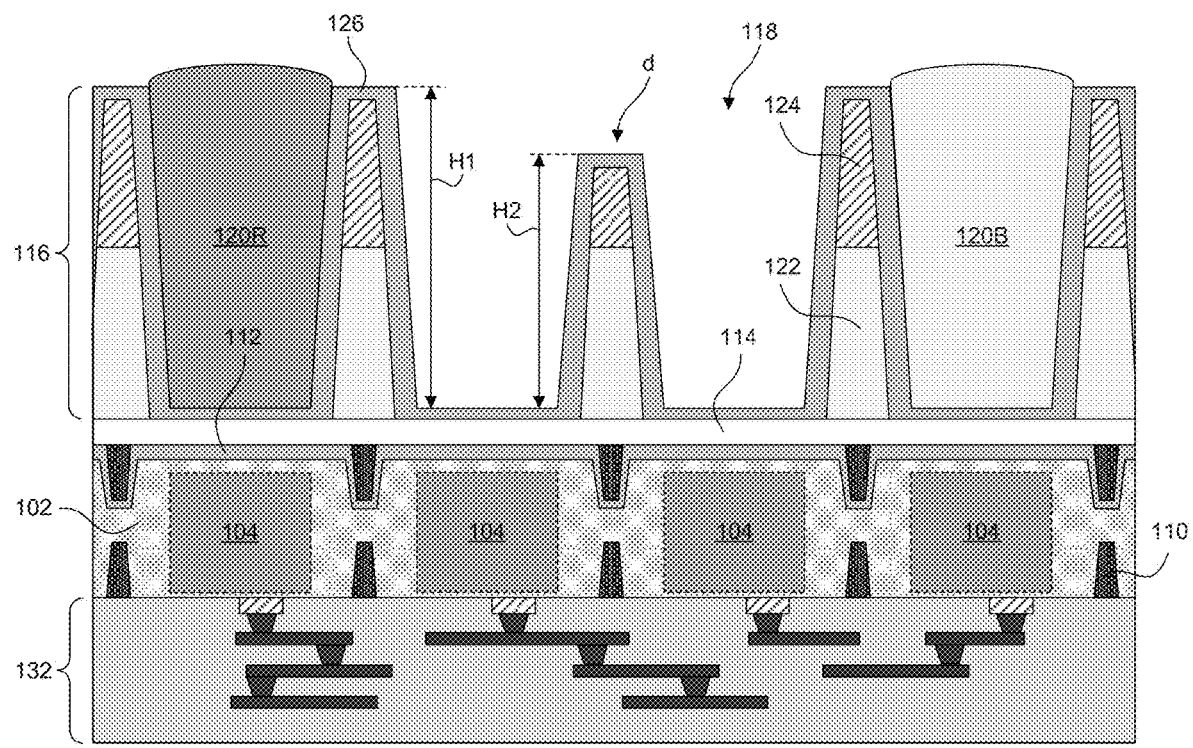
FIG. 7 is a cross-sectional view of a composite grid structure after a sidewall recess process, according to some embodiments.
Figure 8:
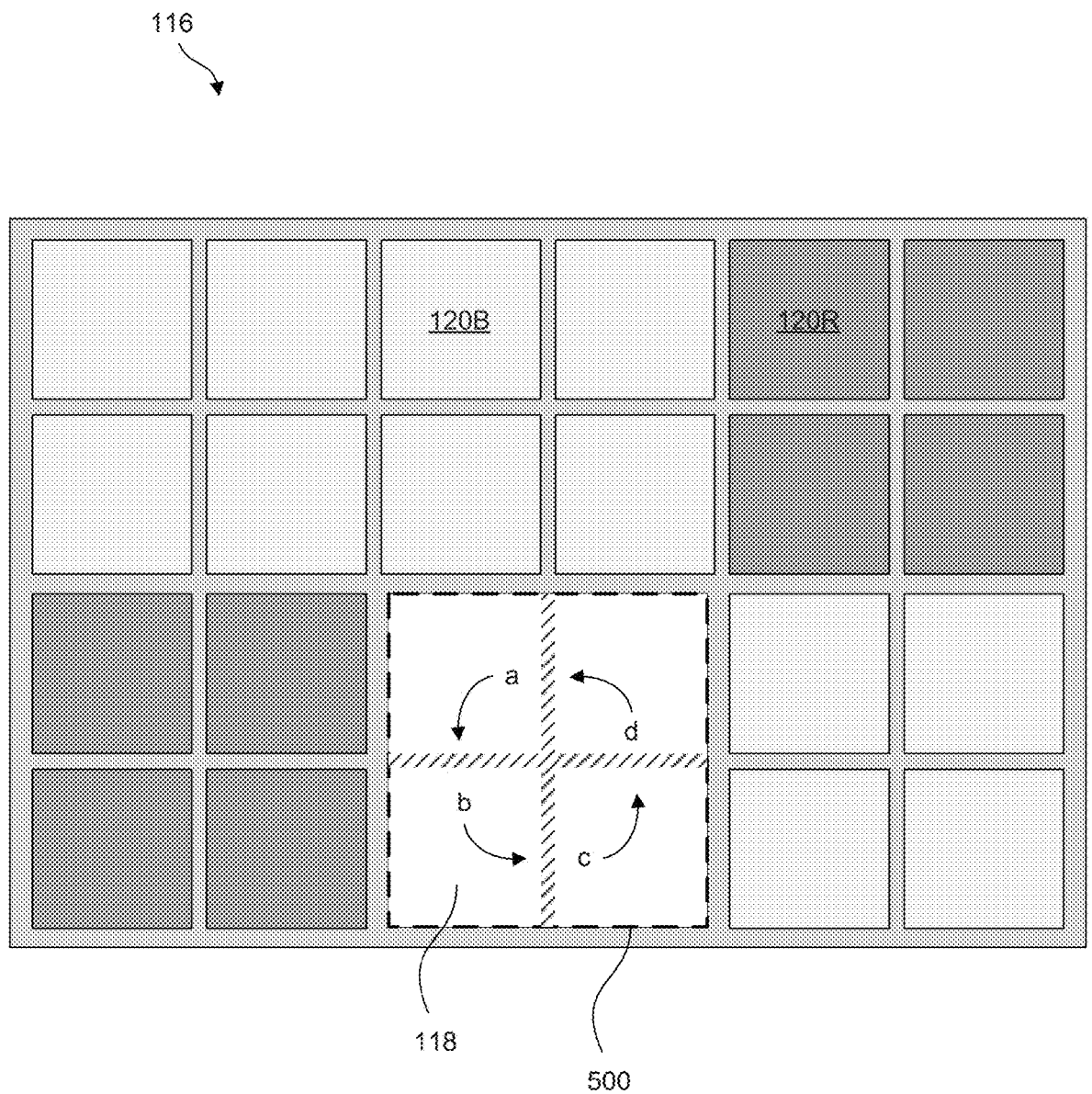
FIG. 8 is a top view of a composite grid structure with a cluster of unoccupied cells having recessed common sidewalls, according to some embodiments.

In operation 304, color filters 120R and 120B are used as masking layers so that the sidewalls of underlying cells 118 in composite grid structure 116 are not recessed. On the other hand, any exposed sidewall of a cell 118 (e.g., not occupied by a color filter) that is subjected to the etch process of operation 304 will be recessed. For example, FIG. 7 shows the partially fabricated structure of FIG. 6 after the etch process of operation 304, where the common sidewall d between adjacent cells 118 has been recessed. The recessed height H2 of sidewall d is shorter than its original height H1. In some embodiments, the etch process of operation 304 is timed so that the height ratio H2/H1 is less than 0.9. For example, if an exposed sidewall is subjected to the timed etch process of operation 304, its height will be reduced by at least 10%. The 10% height reduction, or more, ensures that the recessed sidewalls will be submerged under the color filter when cells 118 are filled. As discussed above, and referring to FIG. 5, common sidewalls a, b, and c of cells 118 within group 500 can be similarly recessed during the etch process of operation 304. For example, FIG. 8 shows the recessed common sidewalls a, b, c, and d.

In some embodiments, the etch process of operation 304 can partially remove exposed portions of passivation layer 126; for example, and referring to FIG. 7, exposed portions of passivation layer 126 include the top and sides surfaces of sidewall d and the bottom surfaces of cell 118. By way of example and not limitation, a new deposition of passivation layer 126 into available cells 118 can be performed to recover any etched portions of passivation layer 126 prior to the next operation of method 300 (e.g., operation 306).

Figure 9:
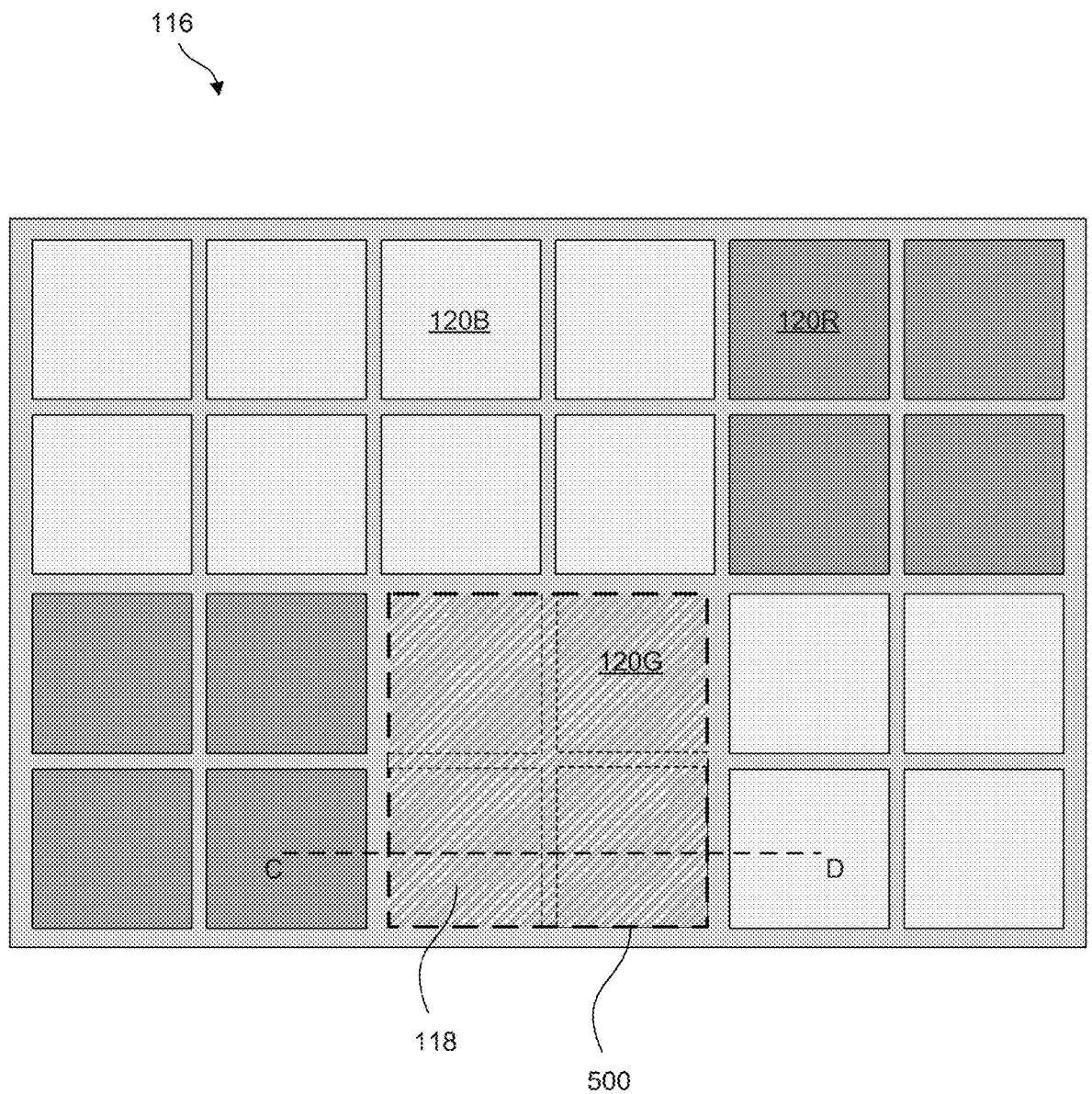
FIG. 9 is a top view of a composite grid structure with a group of cells having recessed common sidewalls and filled with a green color filter, according to some embodiments.
Figure 10:
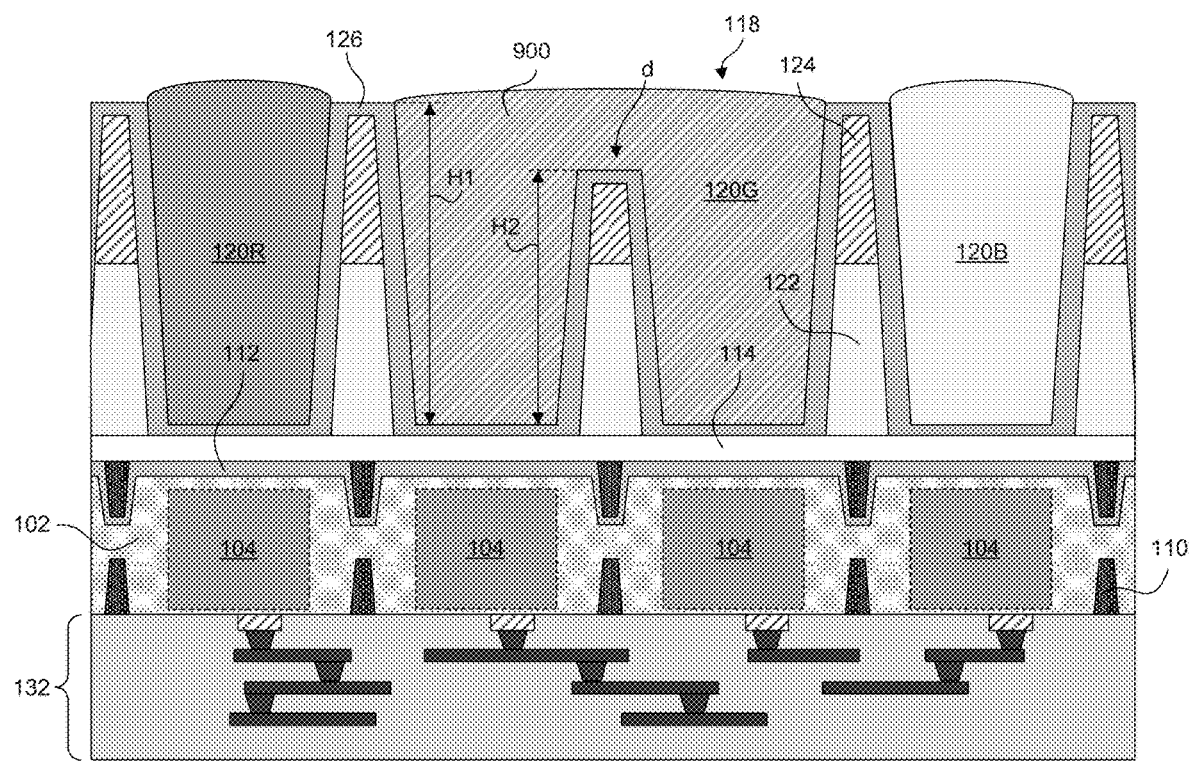
FIG. 10 is a cross sectional view of a composite grid structure after a green filter has been disposed in cells with recessed common sidewalls, according to some embodiments.

In referring to FIG. 3, method 300 continues with operation 306, where a third color filter is disposed in unoccupied cells 118 of the composite grid structure 116. As discussed above, the third color filter can be a green color filter since it exhibits the highest level of surface deformation during baking. In some embodiments, due to recessed common sidewalls a, b, c, and d (shown in FIG. 8), green color filter 120G is allowed expand to more than one unoccupied cells 118 of group 500 in composite grid structure 116—provided that its top surface is above recessed height H2. In other words, recessed sidewalls a, b, c, and d allow green color filter 120G to expand to all of the cells of group 500 and form a single green color filter 120G with an enlarged common surface area. Further, a height ratio H2/H1 of less than 0.9 ensures that the recessed sidewalls will be submerged under green color filter 120G, as discussed earlier. For example, in FIG. 9, which is a top view of composite grid structure 116 after operation 306, green filter 120G is disposed in composite grid structure 116 across all cells 118 of group 500. This means that color filter 120G can occupy a larger surface area on composite grid structure 116, as opposed to red and blue color filters (e.g., 120R and 120B). In FIG. 10, which is a cross section of FIG. 9 along line C-D, top surface 900 of green color filter 120G is below height H1 and above height H2, according to some embodiments.

Figure 11:
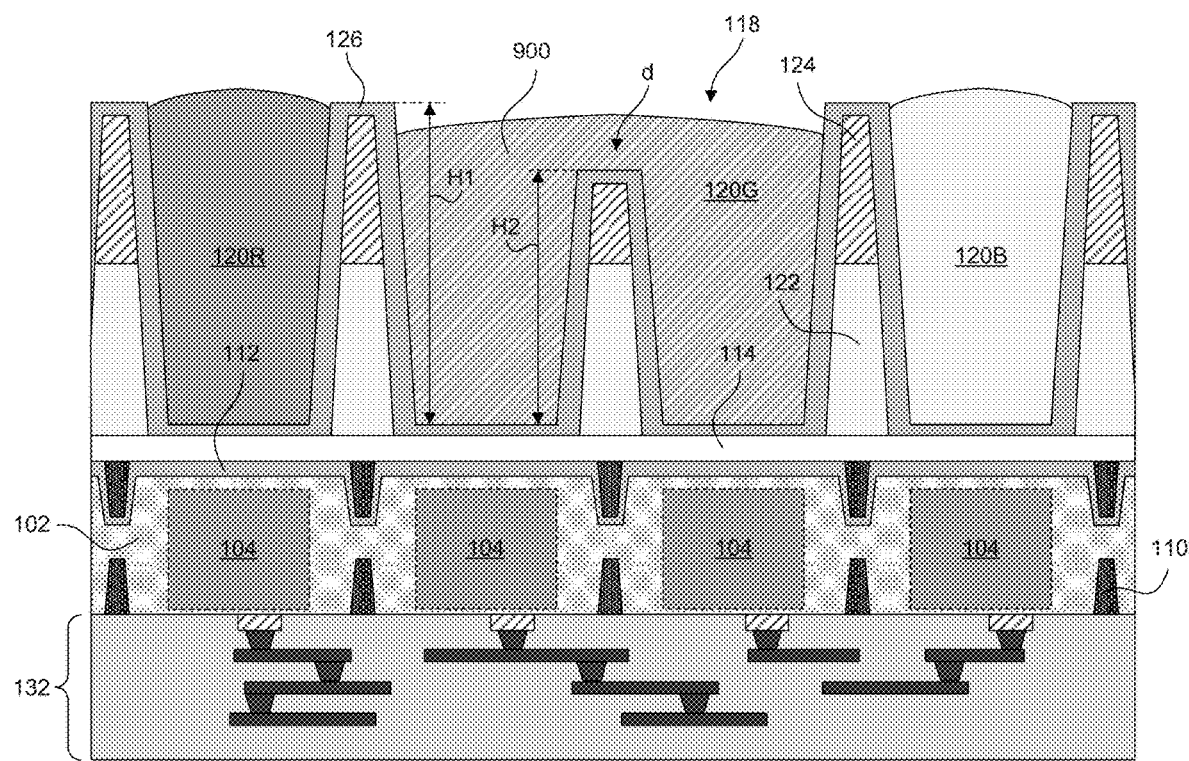
FIG. 11 is a cross sectional view of a composite grid structure with recessed top surfaces of its color filters, according to some embodiments.
Figure 12:
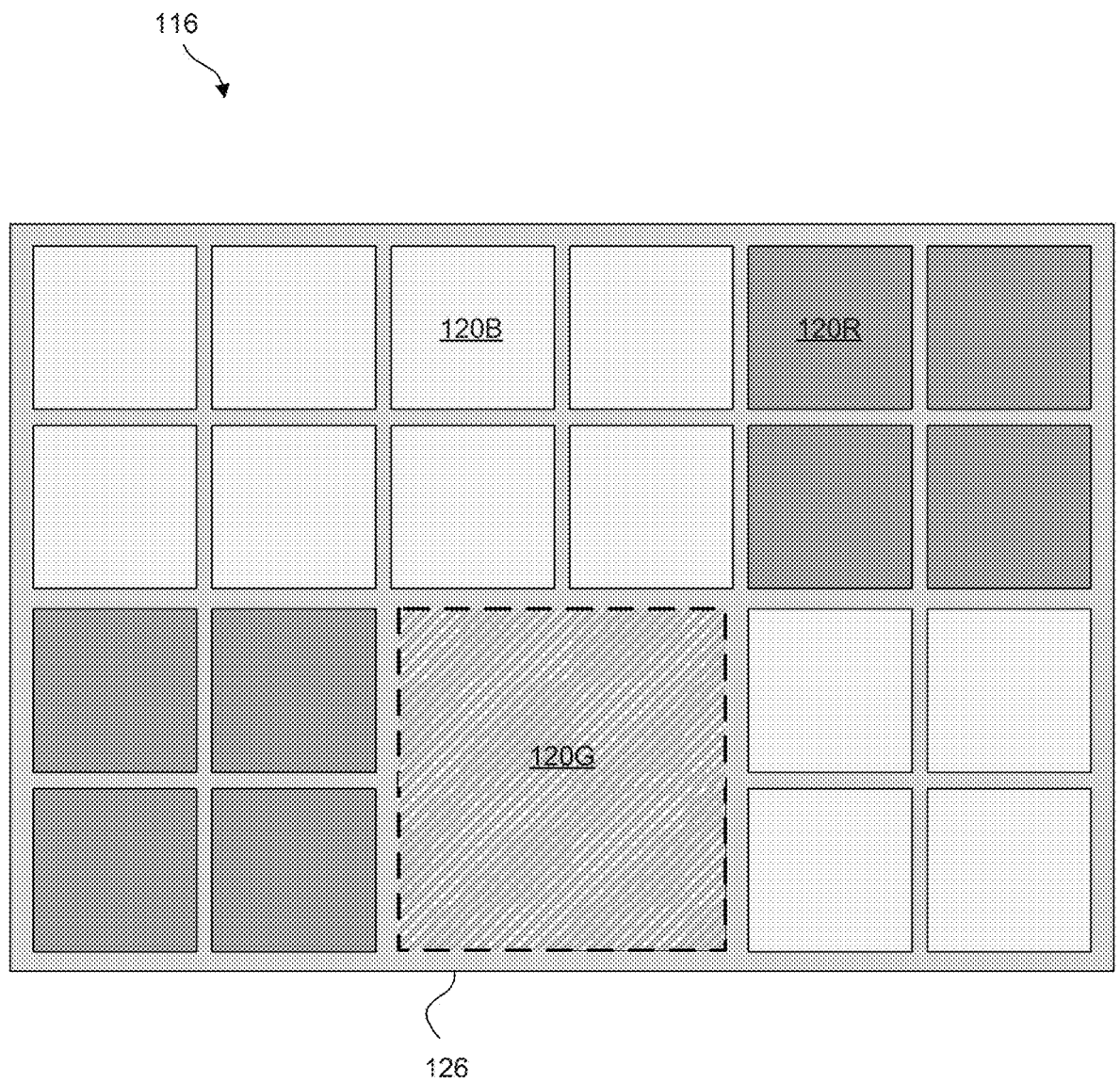
FIG. 12 is a top view of a composite grid structure with recessed top surfaces of its color filters, according to some embodiments.

In some embodiments, a bake is performed to harden the color filters. A subsequent etch process recesses the top surfaces of the color filters 120R, 120G, and 120B) so that passivation layer 126 of the cells with red and blue color filters is exposed over areas of dielectric layer 124, as shown in FIG. 11. According to FIG. 11, the top surface of green color filter 120G is below the top surfaces of red and blue color filter 120R and 120B. FIG. 12 is a top view of composite grid structure 116 after the aforementioned etch process.

In some embodiments, method 300 is not limited to green color filters. For example, sidewalls of any number of cells (e.g., an even number of cells) of any section of the composite grid structure can be recessed to provide a larger surface area for any color filter depending on the image sensor design and characteristics and the shrinkage amount of the color filter's surface after the bake process.

Various embodiments in accordance with this disclosure provide a method to reduce the surface deformation of a color filter after a baking process. Surface deformation can be reduced by recessing the sidewalls of selected sections of a composite grid structure so that a color filter occupying these sections can expand in cells with recessed sidewalls and enlarge its surface area. The proposed method is not limited to single color filter or a specific area of the composite grid structure. Recessing is performed in selected areas of the composite grid structure using photolithography and etch operations. For example, the photolithography and etch operations can isolate sections of the composite grid structure and etch common sidewalk of adjacent cells within the selected area of the composite grid structure.

In some embodiments, an image sensor device includes a grid structure configured to receive one or more color filters over a semiconductor layer, where the grid structure includes a first cell with a first sidewall and a common sidewall, a second cell with a second sidewall and the common sidewall—the common sidewall being shorter than the first and second sidewalls. The image sensor device further includes a color filter disposed in the first and the second cells, where a top surface of the color filter is above the common sidewall and below the first and the second sidewalls.

In some embodiments, an image sensor system includes: a semiconductor layer with one or more radiation-sensing regions formed over an interconnect layer and configured to convert light to electric charge; and a grid structure formed over the semiconductor layer and configured to receive one or more color filters, where the grid structure includes a first cell with a first sidewall and a common sidewall and a second cell with a second sidewall and the common sidewall—the common sidewall being shorter than the first and second sidewalls. The image sensor system further includes a color filter disposed in the first and the second cells, where a top surface of the color filter is above the common sidewall and below the first and second sidewalls; and a micro-lens over each of the first and second cells.

In some embodiments, a method includes: forming a grid structure over a semiconductor layer of an image sensor device, where the grid structure includes a first region with one or more cells having a common sidewall; disposing one or more color filters in a second region of the grid structure; recessing the common sidewall in the first region of the grid structure to form a group of cells with the recessed common sidewall; and disposing another color filter in the group of cells.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. An image sensor device, comprising:
   a semiconductor layer; and
   a grid structure disposed on the semiconductor layer and configured to guide incoming light to regions in the semiconductor layer, wherein the grid structure comprises two or more adjoining cells with common sidewalls, and wherein the common sidewalls are shorter than non-adjoining sidewalls of the two or more adjoining cells.

2. The image sensor device of claim 1, wherein the semiconductor layer comprises one or more sensing regions configured to sense light entering the semiconductor layer from the arid structure.

3. The image sensor device of claim 1, wherein the common sidewalls are shorter than the non-adjoining sidewalls by at least 10%.

4. The image sensor device of claim 1, further comprising:
a transparent material over the grid structure, wherein the transparent material forms a micro-lens structure over the two or more adjoining cells.

5. The image sensor device of claim 1, further comprising a color filter disposed in each of the two or more adjoining cells.

6. The image sensor device of claim 1, wherein the grid structure further comprises a group of adjoining cells, wherein sidewalls of the group of adjoining cells have an equal height.

7. The image sensor device of claim 6, further comprising:
a first color filter disposed in the two or more adjoining cells; and
second color filter different from the first color filter disposed in the group of adjoining cells, wherein a top surface area of the first color filter is larger than that of the second color filter.

8. An image sensor, comprising:
a semiconductor layer with radiation-sensing regions configured to convert light to electric charge;
a grid structure formed over the semiconductor layer comprising:
a first group of adjacent cells comprising adjoining first inner sidewalls between adjacent cells of the first group and non-adjoining first outer sidewalls, wherein the adjoining first inner sidewalls are shorter than the non-adjoining first outer sidewalls; and
a second group of adjacent cells comprising adjoining second inner sidewalls between adjacent cells of the second group and non-adjoining second outer sidewalls, wherein the adjoining second inner sidewalls and the non-adjoining second outer sidewalls have an equal height; and
a color filter disposed in the first group of adjacent cells, wherein the color filter covers a top surface of the adjoining first inner sidewalls and does not cover a top surface of the non-adjoining first outer sidewalls.

9. The image sensor of claim 8, wherein a sidewall height ratio of the adjoining first inner sidewalls to the non-adjoining first outer sidewalls is equal to or less than about 0.9.

10. The image sensor of claim 8, wherein the non-adjoining second inner and outer sidewalls and the non-adjoining first outer sidewalls have an equal height.

11. The image sensor of claim 8, further comprising an other color filter disposed in the second group of adjacent cells, wherein a top surface of the other color filter does not cover a top surface of the adjoining second inner and outer sidewalls.

12. The image sensor of claim 8, wherein the color filter comprises a green color filter.

13. A method, comprising:
forming a grid structure comprising cells over a semiconductor layer, wherein the cells comprise sidewalls with a sidewall height;
masking a region of the grid structure to form a masked region and an unmasked region in the grid structure, wherein the masking prevents etching the sidewalls of the cells in the masked region; and
etching the sidewalk of the cells in the unmasked region of the grid structure to reduce the sidewall height compared to the sidewall height of the cells in the masked region.

14. The method of claim 13, wherein etching the sidewalls of the cells in the unmasked region comprises reducing the sidewall height of the sidewalls by equal to or more than about 10%.

15. The method of claim 13, further comprising:
filling the cells of the unmasked region with a color filter so that etched sidewalls of the cells in the unmasked region are submerged in the color filter.

16. The method of claim 15, wherein the color filter comprises a green color filter.

17. The method of claim 15, wherein filling the cells of the unmasked region with the color filter comprises heating the grid structure to harden with the color filter.

18. The method of claim 13, wherein masking the region of the grid structure comprises:
tilling a region of the grid structure with one or more color filters; and
heating the grid structure to harden the one or more color filters.

19. The method of claim 13, wherein forming the grid structure comprises forming cells with sidewalls having a top passivation layer that is partially etched when etching the sidewalls of the first cells.

20. The method of claim 13, further comprising performing a bake to harden a color filter.

* * * * *

UNITED STATES PATENT AND TRADEMARK OFFICE
CERTIFICATE OF CORRECTION

PATENT NO. : 10,553,631 B2  
APPLICATION NO. : 16/414563  
DATED : February 4, 2020  
INVENTOR(S) : Chu et al.

Page 1 of 1

It is certified that error appears in the above-identified patent and that said Letters Patent is hereby corrected as shown below:

In the Specification

In Column 1, Line 49, delete "sidewalk," and insert -- sidewalls, --, therefor.

In Column 2, Line 26, delete "spatially," and insert -- spatially --, therefor.

In Column 2, Line 54, delete "(QE)" and insert -- (QE) (e.g., --, therefor.

In Column 4, Line 59, delete "a," and insert -- a, b, --, therefor.

In Column 4, Line 63, delete "etc.)" and insert -- etc.). --, therefor.

In Column 7, Line 53, delete "1206" and insert -- 120B --, therefor.

In Column 8, Line 29, delete "However" and insert -- However, --, therefor.

Signed and Sealed this  
Seventh Day of April, 2020

Andrei Iancu  
*Director of the United States Patent and Trademark Office*